United States Patent
Jung et al.

(10) Patent No.: US 7,656,731 B2
(45) Date of Patent: Feb. 2, 2010

(54) SEMI-SHARED SENSE AMPLIFIER AND GLOBAL READ LINE ARCHITECTURE

(75) Inventors: Chang Ho Jung, San Diego, CA (US); Zhiqin Chen, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/694,022

(22) Filed: Mar. 30, 2007

(65) Prior Publication Data

US 2008/0239847 A1     Oct. 2, 2008

(51) Int. Cl.
 *G11C 7/00* (2006.01)
(52) U.S. Cl. .................................. 365/203; 365/205
(58) Field of Classification Search ................ 365/203, 365/205
See application file for complete search history.

(56) References Cited

U.S. PATENT DOCUMENTS

| | | | |
|---|---|---|---|
| 5,970,006 A | | 10/1999 | Numata et al. |
| 6,274,869 B1 * | | 8/2001 | Butler ..................... 250/338.1 |
| 6,414,898 B1 * | | 7/2002 | Chien ..................... 365/230.06 |
| 6,480,424 B1 * | | 11/2002 | Issa ........................ 365/189.02 |
| 7,113,433 B2 | | 9/2006 | Chan et al. |
| 7,158,432 B1 | | 1/2007 | Hunter et al. |
| 2004/0165470 A1 * | | 8/2004 | Terzioglu et al. ....... 365/230.06 |

OTHER PUBLICATIONS

International Search Report-PCT/US2008/057430, International Searching Authority-European Patent Office-Sep. 18, 2008.
Written Opinion-PCT/US2008/057430, International Searching Authority-European Patent Office-Sep. 18, 2008.

* cited by examiner

*Primary Examiner*—Michael T Tran
(74) *Attorney, Agent, or Firm*—Howard Seo; William M. Hooks

(57) ABSTRACT

A memory includes a global read line and a plurality of banks. For each bank, the memory includes a sense amplifier. A discharge circuit discharges the global read line if any one of a plurality of the sense amplifiers is enabled and is outputting a signal having a first digital logic value onto an input lead of the discharge circuit. In this way, the sense amplifiers share the discharge circuit. In one example, the memory includes a pair of differential read lines that are precharged to begin a read operation. After precharging, if either of two sense amplifiers is enabled and outputting the first digital logic value, then a first discharge circuit discharges a first of the global read lines. If either of two sense amplifiers is enabled and outputting the second digital logic value, then a second discharge circuit discharges a second of the global read lines.

19 Claims, 7 Drawing Sheets

GLOBAL READ LINE DATA OUTPUT PATH

GLOBAL READ LINE DATA OUTPUT PATH

PRECHARGE CIRCUITRY AND
COLUMN R/W MULTIPLEXER

SENSE AMPLIFIER

SEMI-SHARED SENSE AMPLIFIER AND GLOBAL READ LINE ARCHITECTURE

BACKGROUND INFORMATION

1. Technical Field

The disclosed embodiments relate to sense amplifiers and global read line architectures in multi-bank semiconductor memories.

2. Background Information

FIG. 1 (Prior Art) is a diagram of a multi-bank memory structure that employs a shared sense amplifier output architecture. For example, data being read out of BANK0 and data being read out of BANK1 both pass through the same sense amplifier 1. Sense amplifier 1 is therefore said to be "shared" between the two banks. Each sense amplifier of FIG. 1 drives a common single-ended global read line (RD) 2 using a tri-state driver. Tri-state driver 3 is the driver for sense amplifier 1. In operation, the output leads of all the tri-state drivers are coupled to the global read line 2 as illustrated. On every memory access, the global read line 2 is driven by one of the tri-state drivers. All others of the tri-state drivers in their high impedance states and are isolated from global read line 2. Global read line 2 is either driven high or low depending on the value of the data being output. The data is driven through the sense amplifier, through the enabled tri-state driver, through the global read line 2, through an output buffer 4, and from the memory. The column of banks and the associated sense amplifiers and tri-state drivers can be replicated such that there are multiple such columns, and such that the tri-state drivers of the various columns all drive the same global read line 2. Similarly, the number of banks in each column can be increased as long as the tri-state drivers of each bank are coupled to the global read line.

The shared architecture of FIG. 1 has several advantages as compared to a non-shared sense amplifier scheme. First, the number of sense amplifiers is halved as compared to the number of banks. By reducing the number of sense amplifiers due to sharing, the amount of integrated circuit area consumed is reduced. Second, device junction capacitance on each global read line is reduced. Rather than having two tri-state drivers coupled to the global read line for each pair of banks, there is only one tri-state driver coupled to the global read line for each pair of banks.

The shared structure of FIG. 1, however, has a disadvantage in that there can be considerable capacitive loading on the input leads of the sense amplifiers. Assume that P-channel transistors 5 were not present. Assume that the column read/write multiplexers are four-to-one multiplexers. Assume that a sense amplifier is shared between two banks as illustrated. In such a situation, there would be eight N-channel transistors coupled to each sense amplifier input lead. Each of these N-channel transistors has a device junction capacitance. The corresponding large amount of capacitance on the input lead of the sense amplifier would slow the data output signal path significantly. To reduce this capacitance, P-channel transistors 5 are sometimes added. P-channel transistors 5 isolate device junction capacitance of the column read/write multiplexers from one another. Unfortunately, placing the P-channel transistors 5 in the data output signal path reduces memory readout speed.

In addition to slowing memory read out speed due to isolating P-channel transistors 5, the shared structure of FIG. 1 involves an undesirable amount of capacitive loading on global read line 2. In the structure of FIG. 1, each tri-state driver involves one N-channel transistor coupled to global read line 2 and one P-channel transistor coupled to global read line 2. Due to the lower mobility of holes than electrons, the P-channel transistor is generally approximately twice as large as the N-channel transistor. The two transistor size units of a P-channel transistor is denoted "2X" in FIG. 1, whereas the one transistor size unit of an N-channel transistor is denoted "1X" in FIG. 1. The size of the transistor has a primary impact on the capacitance added onto the global read line 2 by the transistor. Each such tri-state driver therefore adds approximately three transistor size units of capacitive loading to global read line 2. There are two transistor size units for the P-channel pullup transistor and one transistor size unit for the N-channel pulldown transistor. For an example of four banks, the global read line 2 is loaded with six transistor-size units. This large capacitive loading on the global read line has an undesirable impact on memory readout time.

FIG. 2 (Prior Art) is a diagram of a multi-bank memory structure that employs a non-shared sense amplifier output architecture. There is one sense amplifier for each bank. Rather than using tri-state output drivers to drive a single global read line to either a digital logic high level or a digital logic low level, there are two global read lines. Each global read line 6 and 7 of the non-shared structure of FIG. 2 is only pulled down when data is read out of the memory. The global read lines 6 and 7 are initially precharged to the same voltage by precharge circuitry 8. Precharge circuitry 8 is then disabled. If, for example, the RBIT value being read out of BANKN-1 is a digital logic high and the RBITB value being read out of BANKN-1 is a digital logic low, then pulldown transistor 9 is nonconductive and the pulldown transistor 10 is conductive. Global read line RD is therefore not pulled down but rather stays at its precharged voltage. Global read line RDB, however, is pulled down by transistor 10. The voltage differential between the global read lines 6 and 7 is converted by output buffer 11 into a corresponding digital logic high value that is output onto data output lead 12. If, on the other hand, the RBIT value being read out of BANKN-1 is a digital logic low and the RBITB value being read out of BANKN-1 is a digital logic high, then pulldown transistor 9 is conductive and pulldown transistor 10 is nonconductive. Global read line RD is therefore pulled down toward ground potential by transistor 9. Global read line RDB, however, stays at its precharged voltage. The voltage differential between global read lines 6 and 7 is converted by output buffer 11 into a corresponding digital logic low value on data output lead 12.

The non-shared structure of FIG. 2 has several advantages as compared to the shared structure of FIG. 1. First, because each sense amplifier only receives data from one column read/write multiplexer, the P-channel isolating transistors 5 of FIG. 1 are not provided. This speeds memory readout. Second, the non-shared structure of FIG. 2 has a smaller amount of capacitive loading on the global read lines 6 and 7. In the structure of FIG. 2, for an example of four banks, there are four N-channel pulldown transistors coupled to each the global read line. Each N-channel pulldown transistors is designated in FIG. 2 to involve one transistor size unit of capacitive loading. This one transistor size unit is designated "1X". The precharge circuitry 8 adds some capacitance to the global read lines but there is only one such circuit 8 for each column of banks so the added capacitive loading is relatively small where there are many banks. As can be seen from FIG. 2, the loading of four transistor size units on each global read line of FIG. 2 is better than the loading of six transistor size units of FIG. 1.

Unfortunately, the non-shared structure of FIG. 2 has a disadvantage. The non-shared structure of FIG. 2 involves twice as many sense amplifiers as compared to the shared structure of FIG. 1. In the shared structure of FIG. 1 where there are four banks, only two sense amplifiers are required. In the non-shared structure of FIG. 2 where there are four banks, however, four sense amplifiers are required.

SUMMARY

A multi-bank static random access memory (SRAM) includes a global read line and a plurality of banks. For each bank, the memory includes a sense amplifier. Each of a plurality of the sense amplifiers has an output lead that is coupled to a discharge circuit. Only if a sense amplifier is enabled can the sense amplifier output a signal having a first digital logic value onto its output lead. During a memory read operation, the discharge circuit drives the global read line to a digital logic level (for example, discharges the global read line down toward ground potential) if any one of the plurality of the sense amplifiers is enabled and is outputting a signal having a first digital logic value. In this way, multiple banks are said to "share" the same discharge circuit. Each bank, however, has its own sense amplifier so the banks do not share sense amplifiers. The architecture is therefore referred to here as a "semi-shared" architecture. In one advantageous embodiment, the discharge circuit involves only a single transistor that is coupled to the global read line, thereby reducing or minimizing capacitive loading on the global read line. The transistor can be a single N-channel pulldown transistor.

In one specific embodiment of the novel multi-bank memory, the memory includes a pair of differential global data read out lines. At the beginning of a read operation, precharge circuitry precharges the differential global read lines. For example, both differential global read lines can be precharged to a supply voltage VCC. After precharging, data is read out from one of the memory banks. The only sense amplifier of the memory that is enabled is the sense amplifier associated with the memory bank from which the data is being read. There are two sense amplifiers that are associated with a pair of discharge circuits.

During the data read out operation, if either of two of the sense amplifiers is enabled and outputting a first digital logic value (the data being read out has a first digital logic value), then a first of the discharge circuits discharges a first of the global read lines. This discharging may, for example, involve pulling the voltage on the first global read line down toward ground potential. If, however, neither of sense amplifiers is enabled, or if a sense amplifier is enabled and outputting a second digital logic value (the data value being read out has a second digital logic value), then the first discharge circuit does not discharge the first global read line. If, on the other hand, either of the two sense amplifiers is enabled and outputting the second digital logic value (the data being read out has the second digital logic value), then a second of the discharge circuits discharges a second of the global read lines. If, however, neither of sense amplifiers is enabled, or if a sense amplifier is enabled and outputting the first digital logic value (the data being read out has the first digital logic value), then the second discharge circuit does not discharge the second global read line.

Data output circuitry detects the resulting differential voltage between the differential global data read out lines and drives an appropriate digital logic value signal onto a data output lead of the memory. Because the discharge only need to be able to pull the voltage on the global read lines down, each discharge only needs to have one transistor coupled to its associated global read line. Accordingly, for each additional pair of memory banks in the memory, there are two sense amplifiers and two discharge circuits, but there is only one additional transistor coupled to each of the two global read lines.

In a novel method, a logic gate is used to detect a logical OR condition when either a first signal output from a first sense amplifier has a first digital logic value or when a second signal output from a second sense amplifier has the first digital logic value. A sense amplifier can only output the first digital logic value if it is enabled. The logic gate controls a transistor such that the transistor is conductive during the logical OR condition. When the transistor is conductive, the transistor discharges a global read line towards a first potential (for example, towards ground potential).

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 3:
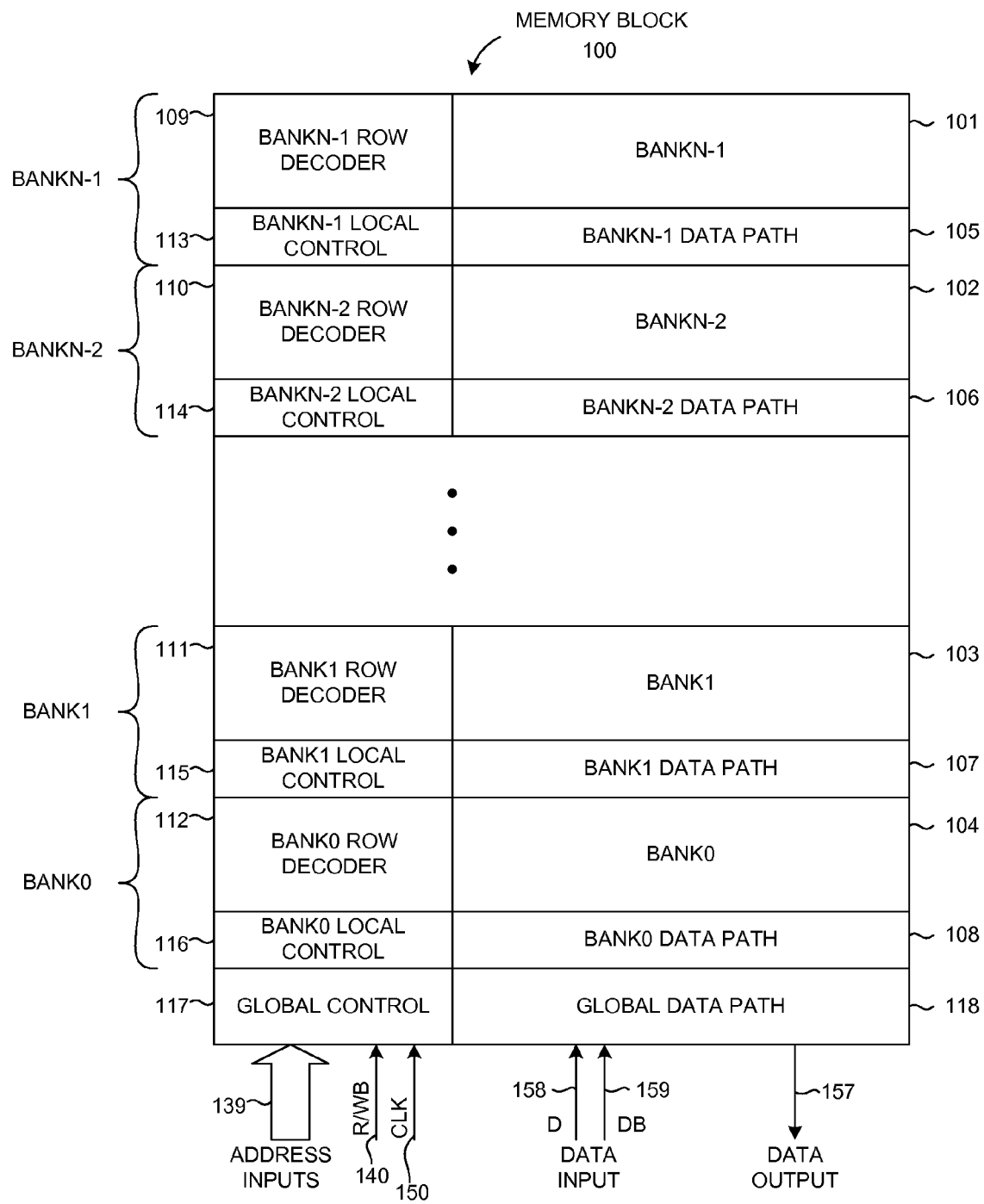
FIG. 3 is a simplified diagram of a floorplan of a multi-bank memory block 100 in accordance with one novel aspect.

FIG. 3 is a simplified diagram of a floorplan of a multi-bank memory block 100 in accordance with one novel aspect. Memory block 100 is a memory block of a static random access memory (SRAM) integrated circuit device. Memory block 100 and is organized to have N banks, where each of the N banks has M memory address locations. In the example of FIG. 3, each memory location is one bit wide.

The first bank 104 is denoted BANK0 in the diagram and the last bank 101 is denoted BANKN-1 in the diagram. To the left of each bank is an associated row decoder block. Below each bank is an associated data path block. To the left of the data path block is an associated bank local control block. The circuitry of these four blocks (the bank block itself and its associated row decoder block, data path block, and local control block) is repeated N times in a column as illustrated. During design of an integrated circuit, a memory design compiler program can be used to change the number of banks by adding or deleting sets of these four blocks. The three vertically oriented dots in FIG. 3 indicate where sets of these four blocks can be added to increase the size of the memory.

Banks BANKN-1, BANKN-2, BANK1 and BANK0 are identified by numerals 101-104 in FIG. 3, respectively. The data path blocks for banks BANKN-1, BANKN-2, BANK1 and BANK0 are identified by numerals 105-108, respectively. The row decoder blocks for banks BANKN-1, BANKN-2, BANK1 and BANK0 are identified by numerals 109-112, respectively. The local control blocks for banks BANKN-1, BANKN-2, BANK1 and BANK0 are identified by numerals 113-116, respectively. At the bottom of the left column, below the bank local control block for BANK 0, is a block 117 called the global control block. At the bottom of the right column, below the data path block for BANK0, is a block 118 called the global data path block.

Figure 4:
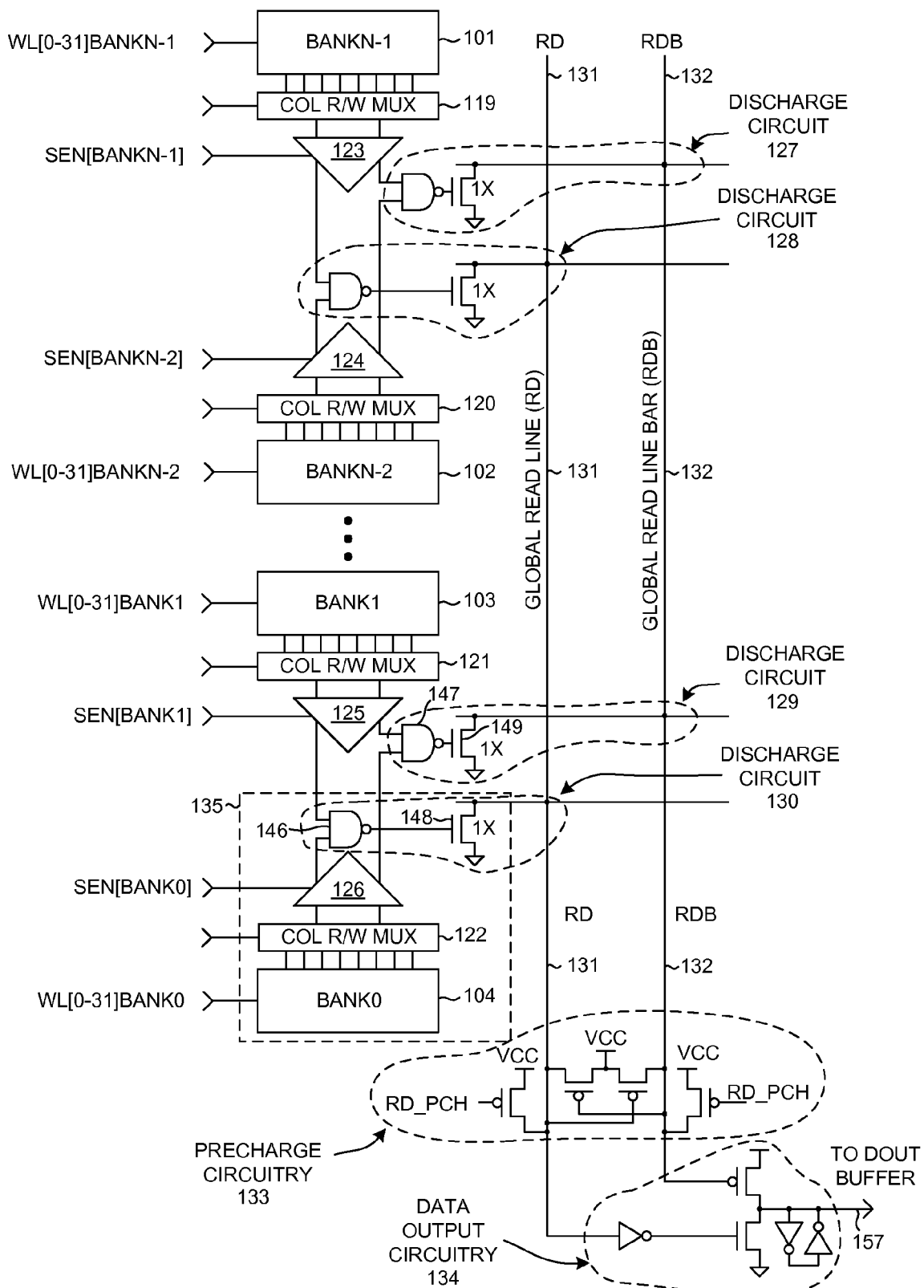
FIG. 4 is a schematic diagram of the data output path of the memory block 100 of FIG. 3.

FIG. 4 is a more detailed diagram the data output path of memory block 100. Each bank of memory cells has an associated column read/write multiplexer and a sense amplifier. The column read/write multiplexers for banks BANKN-1, BANKN-2, BANK1 and BANK0 are identified by numerals 119-122, respectively. The sense amplifiers for BANKN-1, BANKN-2, BANK1 and BANK0 are identified by numerals 123-126, respectively. Both the column read/write multiplexer and the sense amplifier for each bank is disposed in the data path block associated with the bank. For example, column read/write multiplexer 122 and sense amplifier 126 are disposed in data path block 108 and are associated with BANK0.

Associated with each pair of banks is a pair of discharge circuits. For example, discharge circuits 127 and 128 are associated with banks BANKN-1 and BANKN-2, respectively. Discharge circuits 129 and 130 are associated with banks BANK1 and BANK0, respectively. The discharge circuits are disposed along with the sense amplifiers in the data path blocks of FIG. 3.

FIG. 4 illustrates two vertically extending global read conductors 131 and 132, referred to here as global read lines. In the floorplan of FIG. 3, the vertically extending global read lines 131 and 132 extend vertically down and through the right column of blocks. FIG. 4 also illustrates precharge circuitry 133 and data output circuitry 134. The precharge circuitry 133 and data output circuitry 134 are located in the global data path block 118 of FIG. 3.

Figure 5:
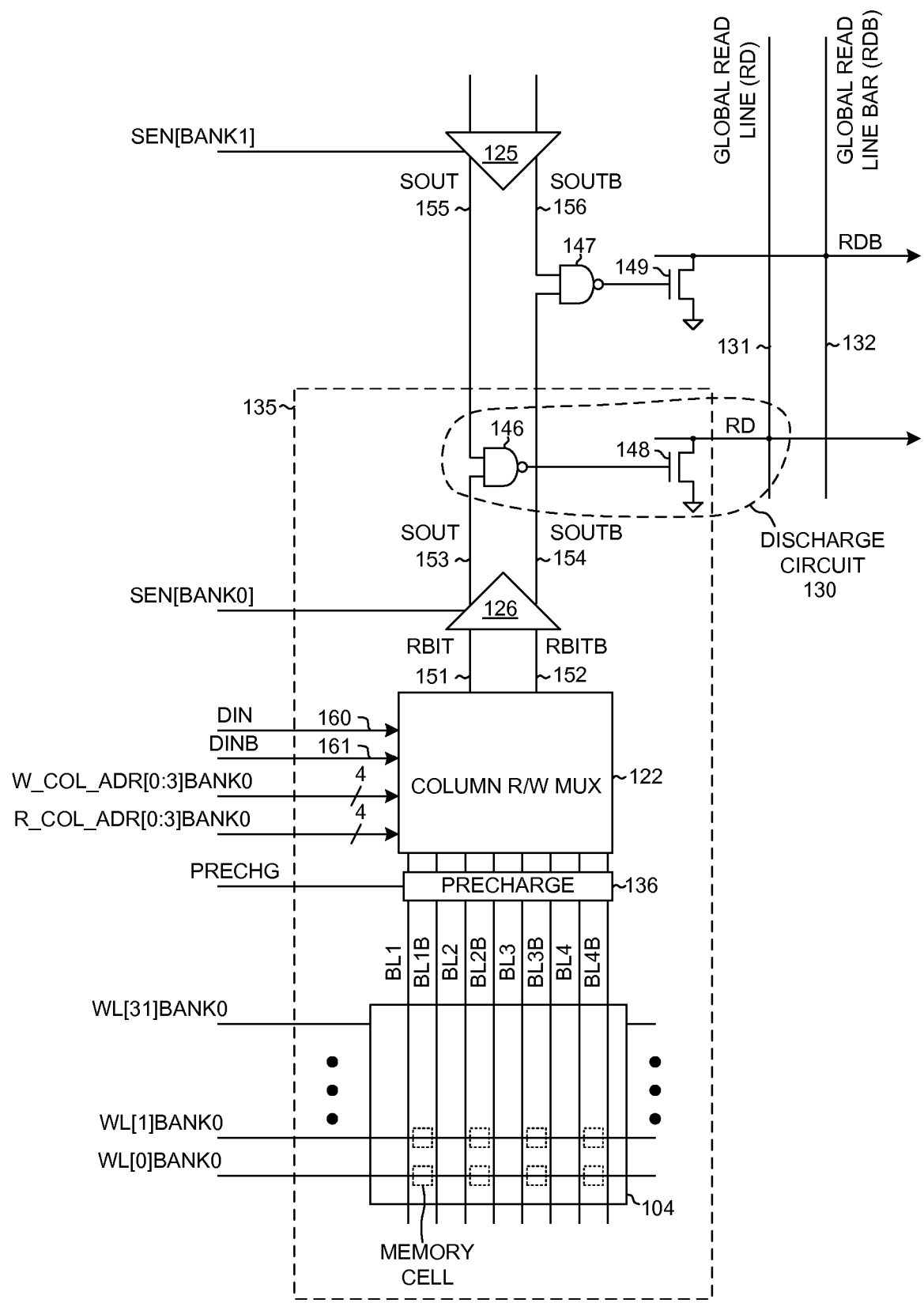
FIG. 5 is a more detailed diagram of portion 135 of FIG. 4.

FIG. 5 illustrates portion 135 of FIG. 4 in more detail. Portion 135 has precharge circuitry 136 disposed between the bank of memory cells 104 and the column read/write multiplexer 122. The column read/write multiplexer 122 actually includes a read multiplexer 137 and a write demultiplexer 138.

Figure 6:
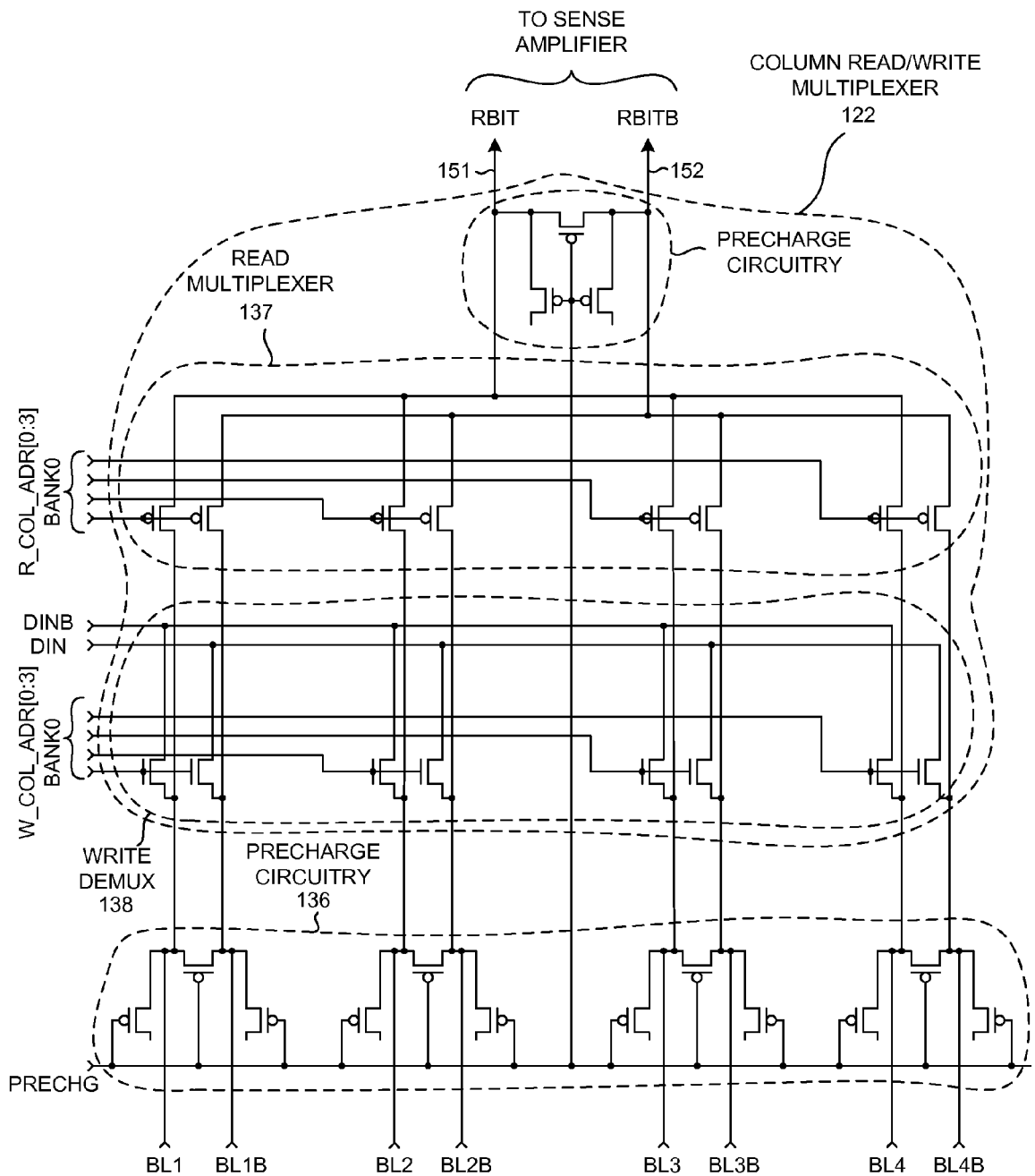
FIG. 6 is a more detailed diagram of the column read/write multiplexer 122 and precharge circuitry 136 of FIG. 5.

FIG. 6 is a more detailed diagram of the column read/write multiplexer 122 and precharge circuitry 136 of FIG. 5.

Figure 7:
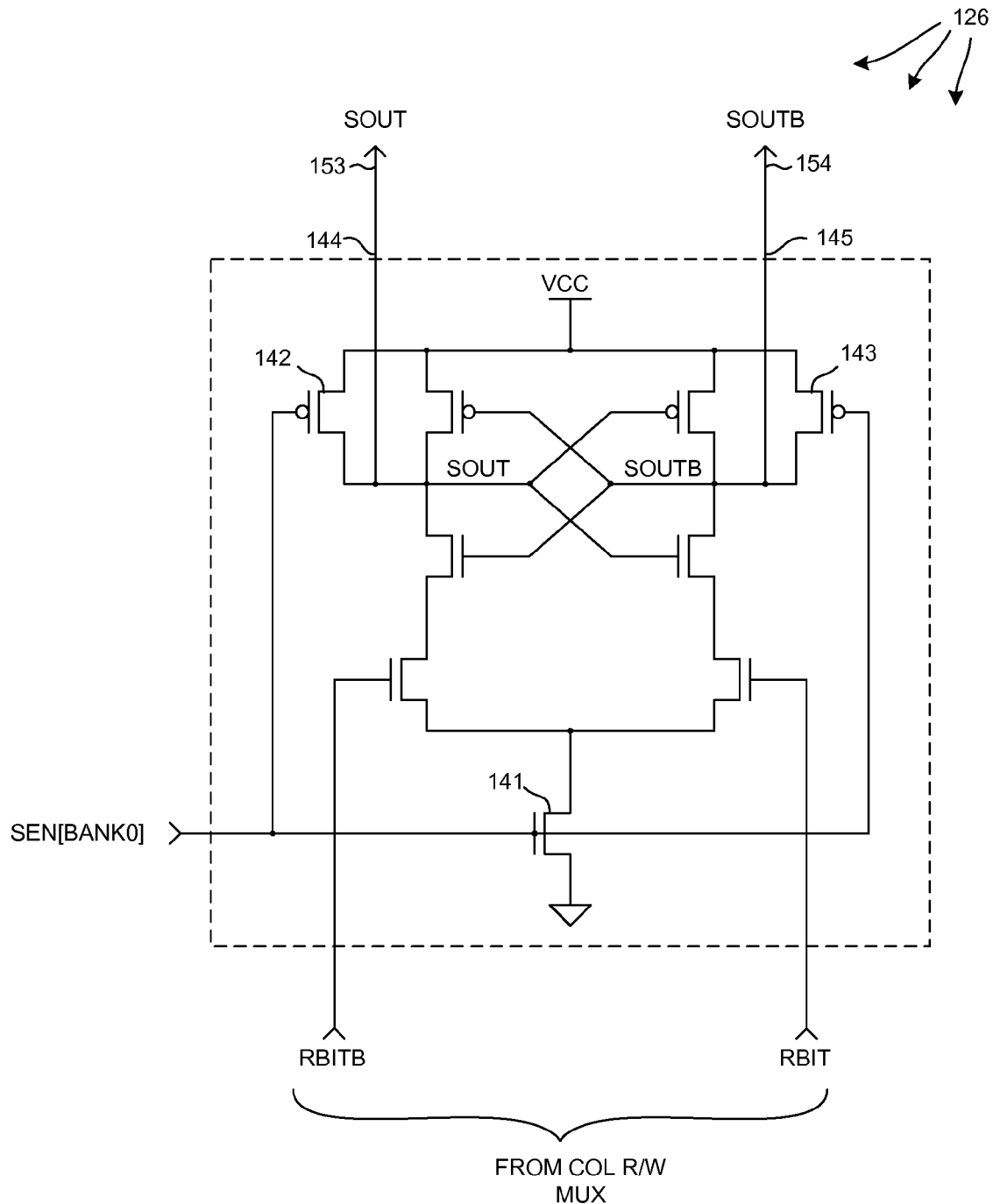
FIG. 7 is a more detailed diagram of sense amplifier 126 of portion 135 of FIG. 5.

FIG. 7 is a more detailed diagram of sense amplifier 126 of portion 135 of FIG. 5.

Read Operation:

In a read operation, an address is placed onto the address input leads 139 of FIG. 3. A digital logic high read signal is placed onto read/write lead 140. The capital "B" in the R/WB designation indicates that placing a digital logic low onto lead 140 indicates a write operation, whereas placing a digital logic high onto lead 140 indicates a read operation. In this initial condition, self-timing circuitry within global control block 117 holds a global sense enable signal for memory block 100 deasserted so that all the local sense enable signals are deasserted and so that all the sense amplifiers are disabled. In the diagram of FIG. 4, SEN[BANK0], SEN[BANK1], SEN[BANKN-2] and SEN[BANKN-1] are the local sense enable signals. These local sense enable signals are held at a digital logic low level.

FIG. 7 shows the circuitry of a sense amplifier in further detail. As can be seen from FIG. 7, when SEN[BANK0] is a digital logic low, then N-channel transistor 141 is non-conductive and P-channel transistors 142 and 143 are conductive. The sense amplifier output signals SOUT and SOUTB on leads 144 and 145 are therefore both pulled up to digital logic high levels. As can be seen from FIG. 5, if the SOUT and SOUTB signals from both sense amplifier 126 and 125 are digital logic high values, then NAND gates 146 and 147 both output digital logic low values. Both pulldown N-channel transistors 148 and 149 are therefore nonconductive. The global read lines 131 and 132 of FIG. 4 are therefore not coupled to ground potential by either of the discharge circuits 129-130. During this initial condition, all the sense amplifiers are disabled and none of the discharge circuits 127-130 is coupling a global read line to ground potential.

During this initial condition, the self-timing circuitry within global control block 117 asserts a precharge signal PRECHG and a read precharge signal RD_PCH. As can be seen from FIG. 6, assertion of the precharge signal PRECHG makes all the P-channel transistors of precharge circuitry 136 conductive. As a consequence, the bit lines of each pair of bit lines are coupled together by the conductive P-channel transistors. Bit lines BL1 and BL1B are, for example, coupled together during this precharge condition. Also, as can be seen from FIG. 4, assertion of the read precharge signal RD_PCH causes all the P-channel transistors of precharge circuitry 133 to be conductive. The global read lines 131 and 132 are therefore coupled together and are coupled to supply voltage VCC.

After the address and read signal have been set up on leads 139 and 140 of FIG. 3, a clock signal on lead 150 is made to transition to initiate the read operation. The self-timing circuit deasserts the precharge signals PRECHG and RD_PCH. The global read lines 131 and 132 are therefore no longer being coupled together but rather are allowed to float. The self-timing circuit asserts an address latch enable signal (ALE) that latches the address bits on lead 139 into an address latch within global control block 117. The address coming out of the address latch is predecoded in global control block 117 to generate bank select enable signals. There is one bank enable signal for each bank, and at most one of the bank enable signals is asserted at a time. Which one of the bank enable signals is asserted depends upon the address on address input leads 139. If the memory location identified by the address on address input leads 139 is in BANK0, for example, then the bank enable signal for BANK0 is the bank enable signal asserted. Similarly, if the memory location identified by the address on address input leads 139 is in BANK1, then the bank enable signal for BANK1 is the bank enable signal asserted.

Each of the row decoder blocks 109-112 contains a row decoder that receives address bits from the address latch. This row decoder, if enabled, decodes the address bits and asserts a word line signal onto an appropriate one of the word lines of the associated bank of memory locations. Each of the row decoders, however, receives a decoder enable signal from the self-timing circuit in global control block 117. This decoder enable signal is gated with the bank enable signal for the associated bank. Accordingly, only one of the row decoders is enabled to drive its associated word lines into its associated bank of memory cells. Assume for explanation purposes that the enabled row decoder is the row decoder for BANK0, then one of the horizontally extending word lines illustrated in FIG. 5 will be asserted. A row of memory cells will be accessed so that values stored in these memory cells will be driven out onto the vertically extending bit lines. Precharge circuitry 136 is now longer precharging the bits line as described above. Accordingly, the row of values read out of BANK0 pass into the column read/write multiplexer 122. Some of the address bits being output from the address latch are decoded and supplied to the column read/write multiplexer 122 so that the column read/write multiplexer 122 will select one of the four pairs of the bit lines. In the example of FIG. 5, the signals R_COL_ADR[0:3]BANK0 are the four decoder output signals that cause column read/write multiplexer 122 to select one pair of the four pairs of bit lines. Within column read/write multiplexer 122, one pair of P-channel transistors is made conductive such that one pair of bit lines is coupled through the column read/write multiplexer of FIG. 6 onto read bit line RBIT 151 and read bit line RBITB 152. Because the operation is a read operation and not a write operation, the W_COL_ADR[0:3] decoder output signals are all deasserted. None of the N-channel transistors of write demultiplexer 138 of FIG. 6 is therefore conductive. The appropriate one of the pairs of bit lines is therefore conducted through column read/write multiplexer 122 and onto read bit lines 151 and 152.

The self-timing circuit within block 117 then asserts the global sense enable signal. As described above, the global sense enable signal is gated with the bank enable signals so that one of the local sense enable signals SEN[BANK0], SEN[BANK1], SEN[BANKN-2] and SEN[BANKN-1] will be asserted. In the read operation example being described here where a memory location in BANK0 is being read, SEN[BANK0] is asserted and all the other sense enable signals, including SEN[BANK1], are not asserted. Sense amplifier 126 of FIG. 5 is therefore enabled and sense amplifier 125 is not enabled. Sense amplifier 126 of FIG. 5 detects data signals on read bit lines 151 and 152 and drives the data out onto SOUT and SOUTB lines 153 and 154. If the data content of the memory cell being read is a first digital value, then one of the signals SOUT and SOUTB will be a digital logic low. If the data content of the memory cell being read is a second digital value, then the other of the signals SOUT and SOUTB will be a digital logic low.

Consider first the situation in which RBIT is a digital logic high and RBITB is a digital logic low. Sense amplifier 126 is non-inverting. Signal SOUT on line 153 is therefore a digital logic high, and signal SOUT on line 154 is a digital logic low. Sense amplifier 125 for BANK1 is not enabled so its SOUT and SOUTB signals on lines 155 and 156 are both digital logic high values. Accordingly, one of the input signals supplied to NAND gate 147 is a digital logic low, NAND gate 147 outputs a digital logic high signal, N-channel pulldown transistor 149 is made conductive, and global read line RDB 132 is pulled down toward ground potential. NAND gate 147 is used to detect when one of the signals on leads 155 or 156 is low. In this logical OR condition, NAND gate 147 controls transistor 149 to be conductive.

Both of the input signals supplied to NAND gate 146 are, however, digital logic high values. NAND gate 146 therefore outputs a digital logic low signal, N-channel transistor 148 is not conductive, and global read line RD 131 is not pulled down toward ground potential, but rather remains at its precharged voltage. NAND gate 146 is used to detect when one of the signals on lines 153 or 155 is low. In this logical OR condition, NAND gate 146 controls transistor 148 to be conductive.

The voltage on global read line RDB 132 is therefore substantially lower than the voltage on global read line RD 131. (The voltage on line RDB may be said to be pulled down to ground potential, but it understood that this is a simplified common terminology used for explanation purposes and that this terminology means that the voltage on line RDB is simply adequately lower than the voltage on line RD such that the data output circuitry 134 can properly detect the differential voltage state). This relative voltage condition is converted and buffered by data output circuitry 134 of FIG. 4 into a digital logic high voltage that is output onto data output lead DOUT 157. DOUT lead 157 of FIG. 4 is the data output lead 147 illustrated in FIG. 3. Data output circuitry 134 is disposed in the global data path block 118 of FIG. 3.

Consider next the situation in which RBIT is a digital low and RBITB is a digital high. Sense amplifier 126 is non-inverting. Signal SOUT on line 153 is therefore a digital low, and signal SOUT on line 154 is a digital high. Sense amplifier 125 for BANK1 is not enabled so its SOUT and SOUTB signals on lines 155 and 156 are both digital logic high values. Accordingly, one of the input signals supplied to NAND gate 146 is a digital logic low, NAND gate 146 outputs a digital logic high signal, N-channel pulldown transistor 148 is made conductive, and global read line RD 131 is pulled down toward ground potential. Both of the input signals supplied to NAND gate 149 are, however, digital logic high values. NAND gate 147 therefore outputs a digital logic low signal, N-channel transistor 149 is not conductive, and global read line RDB 132 is not pulled down toward ground potential, but rather remains at its precharged voltage. The voltage on global read line RD 131 is therefore substantially lower than the voltage on global read line RDB 132. This relative voltage condition is converted and buffered by data output circuitry 134 of FIG. 4 into a digital logic low voltage that is output onto data output lead DOUT 157.

Write Operation:

In a write operation, a data value to be written and its complement are placed onto data input leads 158 and 159 of FIG. 3, respectively. An address of a memory location into which the data value is to be written is placed onto the address input leads 139. A digital logic low write signal is placed onto read/write R/WB lead 140. The self-timing circuitry within global control block 117 holds all local sense enable signals for memory block 100 so that all sense amplifiers are disabled. The signals SOUT and SOUTB on lines 153 and 154 are therefore both held at digital logic high levels. As can be seen from FIG. 5, if the SOUT and SOUTB signals from sense amplifier 126 and sense amplifier 125 are all digital logic high values, then NAND gates 146 and 147 will output digital logic low values. Both pulldown N-channel transistors 148 and 149 will therefore be nonconductive. The global read lines 131 and 132 of FIG. 4 are therefore not coupled to ground potential by any of the discharge circuits 127-130.

During this initial condition, the self-timing circuitry within global control block 117 asserts PRECHG. PRECHG makes all the P-channel transistors of precharge circuitry 136 conductive. The bit lines of each pair of bit lines are coupled together by P-channel transistors within precharge circuitry 136.

After the data, the address and the write signal have been set up, the clock signal on lead 150 of FIG. 3 is made to transition to initiate the write operation. The self-timing circuit deasserts the precharge signal PRECHG such that the bit lines are no longer coupled together in the precharge state. The self-timing circuit asserts a data latch enable signal (DLE) that causes the data and its complement on leads 158 and 159 to be latched into a data latch. The data latch is disposed in the global data path block 118. The latched data value and its complement as they are output from the data latch are supplied onto the data input leads 160 and 161 (see FIG. 5) of the column read/write multiplexer for each of the banks. The self-timing circuit also asserts the address latch enable signal (ALE) such that the address on leads 139 is latched into the address latch in global control block 117.

As described above with respect to the read operation, there is a row decoder for each bank of memory cells. This row decoder is disposed in the block to the left of the associated bank in FIG. 3. Only if this row decoder is enabled can it drive a word line signal onto an appropriate one of the word lines of the associated bank of memory locations such that a row of memory cells is accessed. As described above with respect to the read operation, address bits are decoded to generate the bank enable signals, and the bank enable signals are used to disable all the row decoders except for one. If a row decoder is disabled, then it cannot assert any of its associated word lines. Assume for explanation purposes that the enabled row decoder is the row decoder for BANK0. Then one of the horizontally extending word lines illustrated in FIG. 5 is asserted. A row of memory cells is accessed.

The latched address is also decoded as described above in connection with the read operation to generate the decoded write column address values (W_COL_ADR[0:3]BANK0) and to generate the decoded read column address values (R_COL_ADR[0:3]BANK0). In the case of a write operation, however, the R/WB signal being low prevents any of the read column address values to be asserted (asserted low). Consequently, none of the P-channel transistors of the read multiplexer 137 (see FIG. 6) of the column read/write multiplexer 122 is conductive. The voltages present on the RBIT and RBITB lines 151 and 152 therefore are not coupled through the column read/write multiplexer structure onto bit lines BL1-BL4 and BL1B-BL4B. In the case of the write operation, the R/WB signal being low enables an appropriate one of the write column address values to be asserted (asserted high) for the column read/write multiplexer of the enabled bank. The write demultiplexer 138 (see FIG. 6) of the column read/write multiplexer of the enabled bank therefore conducts the data input value DIN and its complement DINB through the write demultiplexer 138 and onto a selected one of the four pairs of bit lines. The voltages on the other pairs of bit lines remain floating at their precharge voltages.

The data value and its complement are buffered by tri-stable write buffers. These write buffers are enabled by a write clock signal (WCLK) that is generated by the self-timing circuitry. After the data path is established from the output of the data latch to the appropriate one of the memory locations in the appropriate one of the banks of memory cells, the self-timing circuitry asserts the write clock signal (WCLK). This causes the data value and its complement to be written by the enabled data buffer, through the write demultiplexer 138, onto a pair of bit lines, and down into a memory cell in the row of memory cells that has its word line asserted. The write multiplexer of only one bank is enabled due to the bank enable signals gating the write column address values (W_COL_ADR[0:3]) of the various write demultiplexers. A single word line signal is asserted into one of the banks of memory cells due to the bank enable signals gating the row decoder enable signals of the various row decoders of the various banks. The data value is therefore written into only one memory cell of memory block 100.

Figure 1:
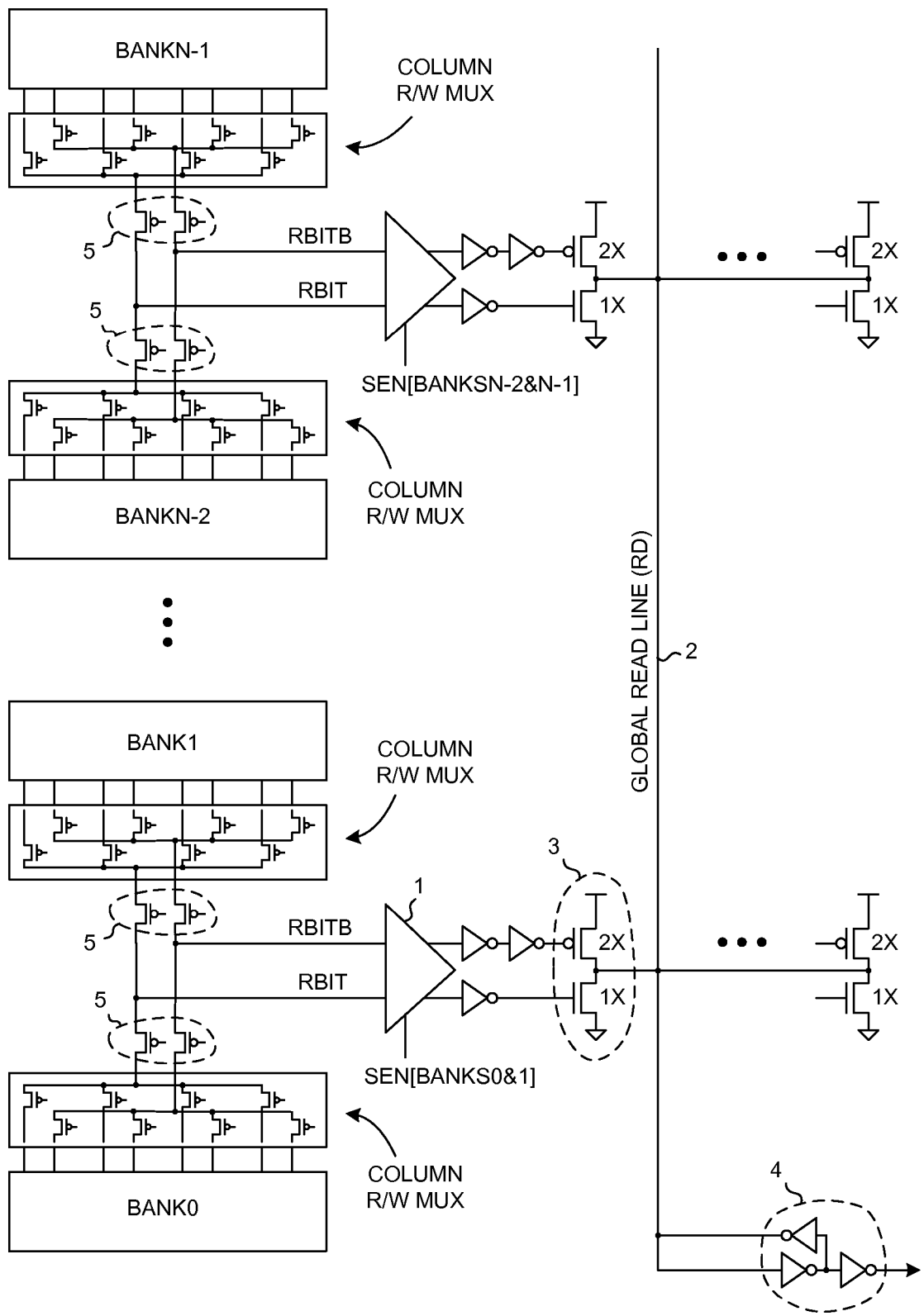
FIG. 1 (Prior Art) is a diagram of a shared sense amplifier memory architecture.
Figure 2:
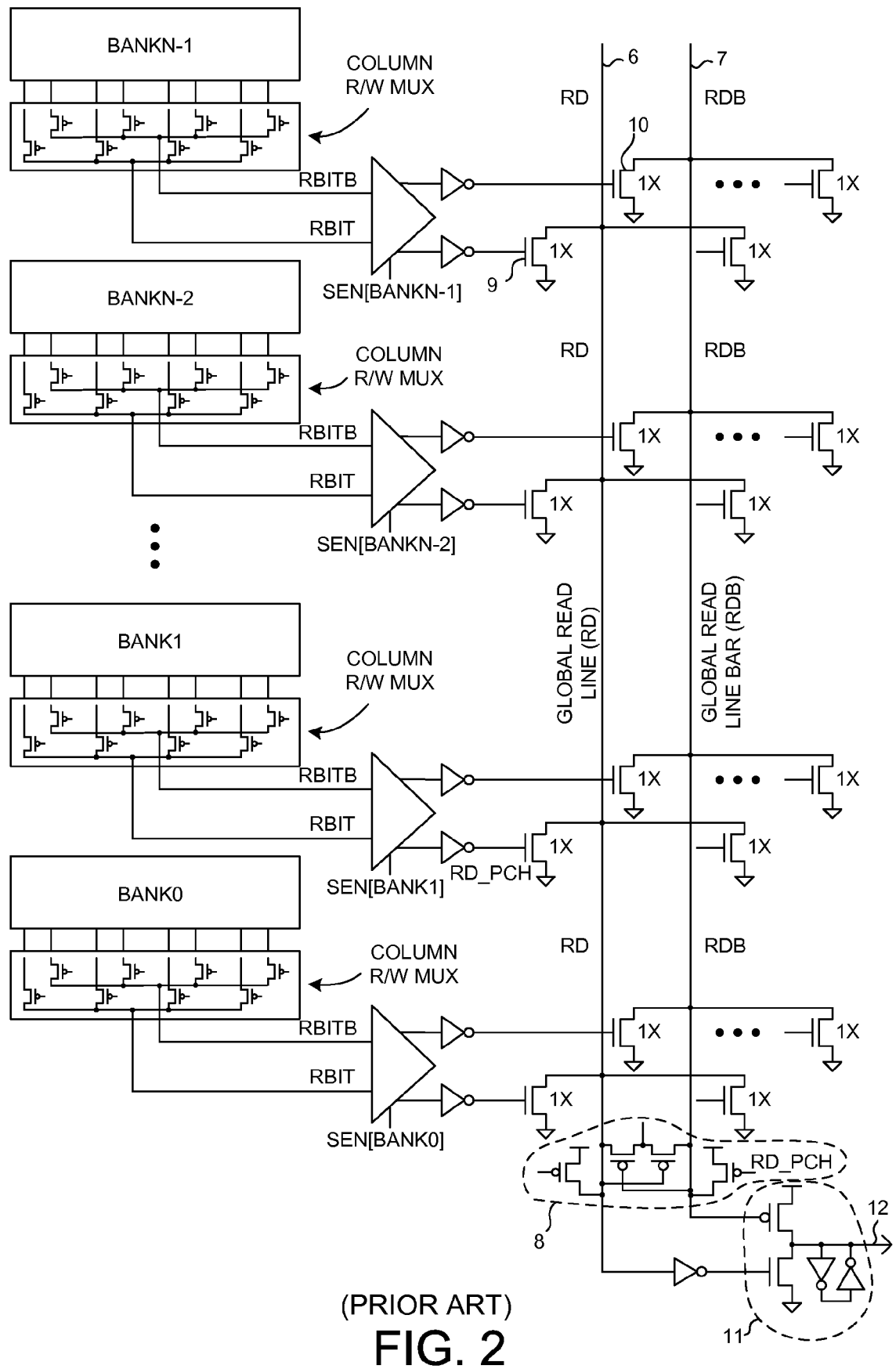
FIG. 2 (Prior Art) is a diagram of a non-shared sense amplifier memory architecture.

Discharge Circuits and Global Read Lines:

In contrast to the prior art shared sense amplifier output architecture of FIG. 1 where coupling an additional pair of banks to a global read line involves coupling an additional three transistor size units to the global read line, and in contrast to the prior art non-shared sense amplifier output architecture of FIG. 2 where coupling an additional pair of banks to a global read line involves coupling an additional two transistor size units to each global read line, the novel semi-shared structure of FIGS. 3-7 allows an additional pair of banks to be coupled to a global read line by coupling just one additional transistor size unit to each global read line. One transistor size unit is designed with a "1X" in FIG. 4. For each additional pair of banks that are to be coupled to global read lines 131 and 132, only one additional N-channel pulldown transistor needs to be coupled to each global read line.

Although certain specific embodiments are described above for instructional purposes, the teachings of this patent document have general applicability and are not limited to the specific embodiments described above. Although an example is described above in which the discharge circuits involved two-input NAND gates that were coupled to two different sense amplifiers, the novel technique is extendable such that the logic gate of the discharge circuit can have more than two input leads and can be coupled to more than two different sense amplifiers. A discharge circuit may, for example, include a four-input NAND gate that drives a pulldown transistor, where the four input leads of the NAND gate are coupled to four different sense amplifiers. Although an example is illustrated above in which the global read lines are differential read lines that carry differential signals, the novel technique applies to single-ended global read lines as well. The discharge circuit, rather than selectively pulling down a precharged read line, may involve or be a tri-state driver that is enabled if any of its associated sense amplifiers is enabled. The tri-state driver can drive the read line to either a digital logic high level or to a digital logic low level. The semi-shared sense amplifier architecture is application to other types of memories (for example, dynamic read only memories (DRAM)) other than SRAM memories. Accordingly, various modifications, adaptations, and combinations of the various features of the described specific embodiments can be practiced without departing from the scope of the claims that are set forth below.

What is claimed is:

1. A memory circuit comprising:
   first global read line;
   a second global read line;
   a first sense amplifier having a first output lead and a second output lead;
   a second sense amplifier having a first output lead and a second output lead;
   a first discharge circuit that discharges the first global read line toward a first potential if a first digital logic value is present on either the first output lead of the first sense amplifier or the first output lead of the second sense amplifier; and
   a second discharge circuit that discharges the second global read line toward the first potential if the first digital logic value is present on either the second output lead of the first sense amplifier or the second output lead of the second sense amplifier;
   wherein the first discharge circuit includes only one transistor that is coupled to the first global read line, and wherein the second discharge circuit includes only one transistor that is coupled to the second global read line.

2. The memory circuit of claim 1, further comprising:
   precharge circuitry coupled to the first and second global read lines, wherein the precharge circuitry selectively couples the first and second global read lines together and simultaneously charges the first and second global read lines toward a second potential.

3. The memory circuit of claim 1, wherein the first discharge circuit does not discharge the first global read line toward the first potential if a second digital logic value opposite the first digital logic value is present on both the first output lead of the first sense amplifier and the first output lead of the second sense amplifier, and wherein the second discharge circuit does not discharge the second global read line toward the first potential if the second digital logic value is present on both the second output lead of the first sense amplifier and the second output lead of the second sense amplifier.

4. The memory circuit of claim 1, wherein the first discharge circuit comprises:
   a logic gate having a first input lead, a second input lead, and an output lead, wherein the first input lead of the logic gate is coupled to the first output lead of the first sense amplifier, wherein the second input lead of the logic gate is coupled to the first output lead of the second sense amplifier; and
   a transistor having a first lead, a second lead and a control lead, wherein the first lead is coupled to the first global read line, and wherein the control lead is coupled to the output lead of the logic gate.

5. The memory circuit of claim 1, further comprising:
   a data output circuit having a first input lead, a second input lead, and an output lead, wherein the first input lead is coupled to the first global read line, and wherein the second input lead is coupled to the second global read line.

6. The memory circuit of claim 1, further comprising:
   a data output circuit that detects a differential voltage between the first and second global read lines and in response to said detecting asserts a digital logic value onto an output lead of the data output circuit.

7. The memory circuit of claim 1, wherein the first sense amplifier can be enabled or disabled, wherein if the first sense amplifier is disabled then the second digital logic value is present on both the first output lead of the first sense amplifier and the second output lead of the first sense amplifier, wherein the second sense amplifier can be enabled or disabled, wherein if the second sense amplifier is disabled then the second digital logic value is present on both the first output lead of the second sense amplifier and the second output lead of the second sense amplifier, and wherein at most one of the first and second sense amplifiers is enabled at a time.

8. The memory circuit of claim 1, wherein the first discharge circuit includes one and only one transistor that is coupled to the first global read line, wherein said one transistor is an N-channel field effect transistor.

9. The memory circuit of claim 1, further comprising:
   a third sense amplifier having a first output lead and a second output lead;
   a fourth sense amplifier having a first output lead and a second output lead;
   a third discharge circuit that discharges the first global read line toward the first potential if the first digital logic value is present on either the first output lead of the third sense amplifier or the first output lead of the fourth sense amplifier, and wherein the third discharge circuit does not discharge the first global read line toward the first potential if the second digital logic value is present on both the first output lead of the third sense amplifier and the first output lead of the fourth sense amplifier; and
   a fourth discharge circuit that discharges the second global read line toward the first potential if the first digital logic value is present on either the second output lead of the third sense amplifier or the second output lead of the fourth sense amplifier; and wherein the fourth discharge circuit does not discharge the second global read line toward the first potential if the second digital logic value is present on both the second output lead of the third sense amplifier and the second output lead of the fourth sense amplifier.

10. The memory circuit of claim 1, further comprising:
    a first bank of memory cells having a plurality of bit lines; and
    a first read multiplexer having a plurality of input leads, a first output lead and a second output lead, wherein the input leads of the first read multiplexer are coupled to the plurality of bit lines, wherein the first output lead of the read multiplexer is coupled to a first input lead of the first sense amplifier, and wherein the second output lead of the read multiplexer is coupled to a second input lead of the first sense amplifier, wherein a data signal being read from the first bank of memory cells passes through one and only one transistor on a path from the first bank of memory cell, through the first read multiplexer, and onto the first input lead of the first sense amplifier.

11. A method comprising:
    using a logic gate to detect a logical OR condition when either a first signal output from a first sense amplifier has a first digital logic value or when a second signal output from a second sense amplifier has the first digital logic value; and
    using the logic gate to control a transistor such that the transistor is conductive during the logical OR condition, wherein the logic gate has an output lead that is coupled to the gate of the transistor, wherein the transistor is an N-channel transistor, wherein the output lead of the logic gate is not coupled to a gate of any other transistor, and wherein the transistor discharges a global read line towards a first potential when the transistor is conductive, wherein the first sense amplifier, the second sense amplifier, the global read line, the transistor, and the logic gate are parts of an integrated circuit memory device.

12. The method of claim 11, wherein the transistor is conductive during the logical OR condition and is only conductive during the logical OR condition.

13. The method of claim 11, wherein the first sense amplifier has a pair of differential signal output leads, wherein the second sense amplifier has a pair of differential signal output leads, and wherein the logic gate has a first input lead that is coupled to one of the differential signal output leads of the first sense amplifier, and wherein the logic gate has a second input lead that is coupled to one of the differential signal output leads of the second sense amplifier.

14. A method comprising:
    using a logic gate to detect a logical OR condition when either a first signal output from a first sense amplifier has a first digital logic value or when a second signal output from a second sense amplifier has the first digital logic value, wherein the first sense amplifier has a single-ended signal output lead, wherein the second sense amplifier has a single-ended signal output lead, wherein the logic gate has a first input lead that is coupled to the single-ended signal output lead of the first sense amplifier, and wherein the logic gate has a second input lead that is coupled to the single-ended signal output lead of the second sense amplifier; and
    using the logic gate to control a transistor such that the transistor is conductive during the logical OR condition, wherein the transistor discharges a global read line towards a first potential when the transistor is conductive, wherein the first sense amplifier, the second sense amplifier, the global read line, the transistor, and the logic gate are parts of an integrated circuit memory device.

15. A method comprising:
   using a logic gate to detect a logical OR condition when either a first signal output from a first sense amplifier has a first digital logic value or when a second signal output from a second sense amplifier has the first digital logic value;
   supplying a first sense enable signal to the first sense amplifier such that the first signal can only be at the first digital logic value when the first sense enable signal is asserted, wherein when the first sense enable signal is deasserted the first signal is at a second digital logic value opposite the first digital logic value;
   supplying a second sense enable signal to the second amplifier such that the second signal can only be at the first digital logic value when the second sense enable signal is asserted, wherein when the second sense enable signal is deasserted the second signal is at the second digital logic value opposite the first digital logic value; and
   using the logic gate to control a transistor such that the transistor is conductive during the logical OR condition, wherein the transistor discharges a global read line towards a first potential when the transistor is conductive, wherein the first sense amplifier, the second sense amplifier, the global read line, the transistor, and the logic gate are parts of an integrated circuit memory device.

16. A method comprising:
   using a first logic gate to detect a first logical OR condition when either a first signal output from a first sense amplifier has a first digital logic value or when a second signal output from a second sense amplifier has the first digital logic value; using the first logic gate to control a first transistor such that the first transistor is conductive during the first logical OR condition, wherein the first transistor couples a first global read line toward a first potential when the first transistor is conductive, wherein the first logic gate has an output lead that is coupled to the gate of the first transistor, wherein the transistor is an N-channel transistor, and wherein the output lead of the first logic gate is not coupled to a gate of any other transistor;
   using a second logic gate to detect a second logical OR condition when either a second signal output from the first sense amplifier has a first digital logic value or when a second signal output from the second sense amplifier has the first digital logic value; and
   using the second logic gate to control a second transistor such that the second transistor is conductive during the second logical OR condition, wherein the second transistor couples a second global read line toward the first potential when the second transistor is conductive, wherein the first sense amplifier, the first global read line, the first transistor, the first logic gate, the second sense amplifier, the second global read line, the second transistor, and the second logic gate are parts of a memory device.

17. A memory device comprising:
   a first sense amplifier that receives a first sense enable signal, wherein if the first sense enable signal is not asserted then the first sense amplifier cannot output a first digital logic value onto an output lead of the first sense amplifier;
   a second sense amplifier that receives a second sense enable signal, wherein if the second sense enable signal is not asserted then the second sense amplifier cannot output the first digital logic value onto an output lead of the second sense amplifier; a read line; and
   means for coupling the read line toward a ground potential if either: 1) the first sense enable signal is asserted and the first sense amplifier is outputting the first digital logic value onto the output lead of the first sense amplifier, or 2) the second sense enable signal is asserted and the second sense amplifier is outputting the first digital logic value onto the output lead of the second sense amplifier, wherein the means comprises a logic gate and a transistor, wherein the logic gate has an output lead that is coupled to the gate of the transistor, wherein the transistor is an N-channel transistor, and wherein the output lead of the logic gate is not coupled to a gate of any other transistor.

18. The memory device of claim 17, wherein the means includes only a single transistor that is coupled to the read line, and wherein the read line and a second read line together are a pair of differential read lines that carry differential voltage signals.

19. The memory device of claim 18, wherein the logic gate comprises:
   a first input lead coupled to the output lead of the first sense amplifier, a second input lead coupled to the output lead of the second sense amplifier, and an output lead coupled to a gate of the transistor.

* * * * *